(12) United States Patent
Boca et al.

(10) Patent No.: US 11,491,650 B2
(45) Date of Patent: Nov. 8, 2022

(54) DISTRIBUTED INFERENCE MULTI-MODELS FOR INDUSTRIAL APPLICATIONS

(71) Applicant: ABB Schweiz AG, Baden (CH)

(72) Inventors: Remus Boca, Simsbury, CT (US); Zhou Teng, Hartford, CT (US); Thomas Fuhlbrigge, Ellington, CT (US); Magnus Wahlstrom, Vasteras (SE); Johnny Holmberg, Hallstahammer (SE)

(73) Assignee: ABB Schweiz AG, Baden (CH)

( * ) Notice: Subject to any disclaimer, the term of this patent is extended or adjusted under 35 U.S.C. 154(b) by 293 days.

(21) Appl. No.: 16/720,585

(22) Filed: Dec. 19, 2019

(65) Prior Publication Data

US 2020/0198129 A1 Jun. 25, 2020

Related U.S. Application Data

(60) Provisional application No. 62/781,775, filed on Dec. 19, 2018.

(51) Int. Cl.
| | | |
|---|---|---|
| B25J 9/16 | (2006.01) |
| G06N 7/06 | (2006.01) |
| G06F 30/33 | (2020.01) |
| G06N 5/02 | (2006.01) |
| G06F 30/00 | (2020.01) |
| G06F 11/00 | (2006.01) |
| G06N 5/00 | (2006.01) |
| G06N 3/12 | (2006.01) |
| G06T 1/00 | (2006.01) |
| G06N 20/00 | (2019.01) |

(52) U.S. Cl.
CPC .............. *B25J 9/163* (2013.01); *B25J 9/1697* (2013.01); *G06F 11/00* (2013.01); *G06F 30/00* (2020.01); *G06F 30/33* (2020.01); *G06N 3/126* (2013.01); *G06N 5/00* (2013.01); *G06N 5/02* (2013.01); *G06N 7/06* (2013.01); *G06N 20/00* (2019.01); *G06T 1/0014* (2013.01)

(58) Field of Classification Search
CPC ......... B25J 9/163; B25J 9/1697; G06N 20/00; G06N 3/126; G06N 5/00; G06N 5/02; G06N 7/06; G06F 30/33; G06F 30/00; G06F 11/00; G06T 1/0014
See application file for complete search history.

(56) References Cited

U.S. PATENT DOCUMENTS

| | | | |
|---|---|---|---|
| 6,804,600 B1 | 10/2004 | Uluyol et al. | |
| 9,671,777 B1* | 6/2017 | Aichele | B25J 9/1666 |
| 9,811,074 B1* | 11/2017 | Aichele | G06N 7/04 |
| 2005/0256611 A1 | 11/2005 | Pretlove et al. | |
| 2018/0099408 A1* | 4/2018 | Shibata | B25J 9/1674 |
| 2018/0341248 A1 | 11/2018 | Mehr et al. | |
| 2019/0047149 A1* | 2/2019 | Wouhaybi | B25J 9/1666 |
| 2019/0054631 A1* | 2/2019 | Govindarajan | B25J 9/1679 |
| 2019/0126472 A1 | 5/2019 | Tunyasuvunakool et al. | |
| 2019/0147245 A1 | 5/2019 | Qi et al. | |

(Continued)

*Primary Examiner* — Phillip H Nguyen
(74) *Attorney, Agent, or Firm* — Leydig, Voit & Mayer, Ltd.

(57) ABSTRACT

Robotic visualization systems and methods include running and analyzing perception algorithms and models for robotic visualization systems on multiple computing platforms to obtain a successful complete an object processing request.

18 Claims, 2 Drawing Sheets

(56) References Cited

U.S. PATENT DOCUMENTS

| | | |
|---|---|---|
| 2019/0202053 A1* | 7/2019 | Tan .................. B25J 9/1671 |
| 2019/0212752 A1* | 7/2019 | Fong .................. G05D 1/0274 |
| 2019/0228495 A1 | 7/2019 | Tremblay et al. |
| 2019/0314984 A1 | 10/2019 | Gonzalez Aguirre et al. |
| 2020/0201268 A1 | 6/2020 | Boca et al. |
| 2020/0202178 A1 | 6/2020 | Boca et al. |

* cited by examiner

DISTRIBUTED INFERENCE MULTI-MODELS FOR INDUSTRIAL APPLICATIONS

CROSS-REFERENCE TO RELATED APPLICATION

The present application claims the benefit of the filing date of U.S. Provisional Application Ser. No. 62/781,775 filed on Dec. 19, 2018, which is incorporated herein by reference.

TECHNICAL FIELD

The present application generally relates to robotic visualization systems, and more particularly, but not exclusively, to system and methods for running and analyzing multiple perception algorithms and models for robotic visualization systems.

BACKGROUND

Industrial robots are enhanced with vision systems to provide adaptability and flexibility in their operations. For example, one of the main tasks of a vision system integrated with a robot is to recognize one or more objects of interest and calculate the object's positions. The knowledge of object type and/or position is used by the robot to perform its tasks such as material handling, paint, welding, dispensing, assembly, etc. There are many applications where robust object calculations from visual data are critical and required, such as for categorization, detection, location, sorting, segmentation, and primitive extraction.

The current vision systems for robots use perception algorithms running either on a local computer or server, or remotely in a cloud. The algorithms typically use just one visual model for each processing perception task or one shared model between multiple processing tasks. For example, in the case of geometric pattern matches, a hierarchical pyramid of edges of an object is built for different scales, rotation angles, and displacements. At runtime, an image is compared against the models in the hierarchical pyramid, and object type and/or location is calculated. In the case of an artificial neural network, network model metadata network architecture and network parameters are calculated. At runtime, information about objects in an image is inferred by running the image through the network. In these cases, the perception algorithms depend on the robustness of the pyramid hierarchical search, or on the quality of one network architecture and its parameters. One perception algorithm and one model is ran for a perception task.

Some existing robotic visualization systems have various shortcomings relative to certain applications. Accordingly, there remains a need for further contributions in this area of technology.

SUMMARY

There is disclosed herein systems and methods for robotic visualization in which a priority graph of paired algorithms and models {algorithm, model} for one or more perception tasks are run on a computing platform, with each pair {algorithm, model} suitable for an available computational platform. This solution allows a very robust and efficient execution of the robotic perception tasks. Failure cases are monitored, and partial or complete perception training is triggered in case similar conditions are acknowledged.

In contrast, systems in current use employ a single algorithm and model to calculate one or more object characteristics such as object type, object absence/presence, object location, and characteristics to be used by the robot for its operation. One single algorithm paired with one model that is run on a single platform is prone to failures and doesn't take advantage of the computational platforms available to a robotic system.

This summary is provided to introduce a selection of concepts that are further described below in the illustrative embodiments. This summary is not intended to identify key or essential features of the claimed subject matter, nor is it intended to be used as an aid in limiting the scope of the claimed subject matter. Further embodiments, forms, objects, features, advantages, aspects, and benefits shall become apparent from the following description and drawings.

BRIEF DESCRIPTION OF THE FIGURES

The features, aspects, and advantages of the present disclosure will become better understood with regard to the following description, appended claims, and accompanying drawings where:

DETAILED DESCRIPTION OF THE ILLUSTRATIVE EMBODIMENTS

Figure 1:
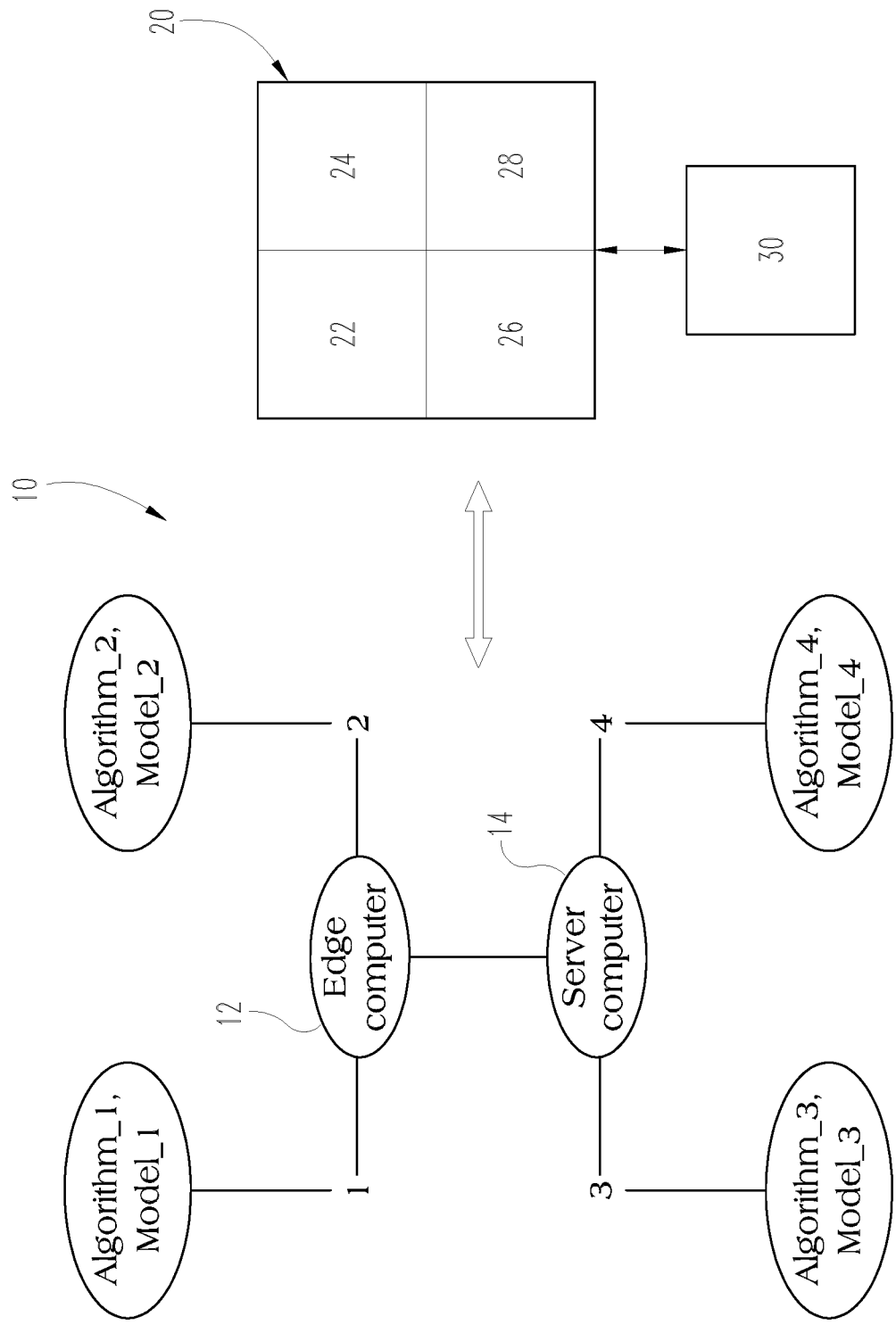
FIG. 1 is a schematic illustration of a computing system for mapping data sets according to one exemplary embodiment of the present disclosure.

For the purposes of promoting an understanding of the principles of the application, reference will now be made to the embodiments illustrated in the drawings and specific language will be used to describe the same. It will nevertheless be understood that no limitation of the scope of the application is thereby intended. Any alterations and further modifications in the described embodiments, and any further applications of the principles of the application as described herein are contemplated as would normally occur to one skilled in the art to which the application relates.

Referring to FIG. 1, an illustrative robot computing system 10 is shown schematically. It should be understood that the system 10 shown herein is exemplary in nature and that variations in the computing system 10 are contemplated herein. The computing system 10 can include at least one edge computer 12 and at least one server computer 14 in operative communication with the edge computer 12. FIG. 1 also graphically illustrates example mapping sets of algorithms {algorithm, model} where the priority of execution is represented by the edge weight, e.g. {Algorithm_1, Model_1}; {Algorithm_2, Model_2}; etc. an illustrative robot system 10 is shown schematically.

It should be understood that the robot computing system 10 shown herein is exemplary in nature and that variations in the robot computing system 10 are contemplated herein. The robot computing system 10 can include at least one robotic cell 20 with a robot (including for example a robot arm 22, a robot tool 24, one or more sensors 26 such as for visualization or detection, and a robot controller 28), and one or more objects 30 that are handled, observed or otherwise processed by robotic cell 20 performing one or more perception tasks in the workspace of the robotic cell 20. The edge computer 12 can be local to or integrated into the robotic cell 20, and server computer 14 can be remote from the robotic cell 20.

The proposed systems and methods include multiple perception algorithms associated with multiple models run locally or remotely instead of just one algorithm with one model running on one platform. The algorithms and models can be provided with a graph having weighted edges showing the priority, and nodes that include mapping between the algorithms and models.

The proposed systems and methods include the algorithms and models being selected/designed based on computation power requirements, speed, and robustness to run on a specific computational platform. If running the entire graph fails to produce results, the failure and associated data can be classified and stored.

Conditions for triggering training can also be established and set. The training can be set to run in parallel while keeping the system running. New models from training can be used to replace existing ones after training and evaluation confirm the new models are better. The proposed systems and methods also allow a perception system to learn and adapt to new environment conditions or object changes over time because training is triggered after monitoring and classifying perception failure cases.

The proposed systems and methods include local and remote, distributed algorithms and models that allow robust and accurate perception task execution. Perception tasks can include, for example, categorization/classification, detection, location, sorting, segmentation, tracking, and image or geometric primitive extraction. The proposed systems and methods use a hierarchical graph with suitable perception algorithms for each computation platform.

For example, in a robot application, an edge computer 12 can use models and network architectures suitable for fast processing and average accuracy, and remote server(s) 14 can use one or more sophisticated models and network architectures that are accurate and robust. The remote server(s) 14 can be computationally powerful and enabled to perform complex and advanced calculations. If a perception task fails on the edge computer 12 and on the server computer 14, one of the edge computer 12 and server computer 14 can provide a monitoring function for the failure cases. If the same failure is observed as repeating, a training procedure can be triggered to improve all or some of the models.

The present disclosure includes a graph of perception algorithms running in a priority order on multiple computational platforms. For highly robust applications, the perception algorithms can run in parallel and the results can be matched against each other. Algorithms and models are selected based on multiple criteria such as computational power needs, speed of algorithms, type of models, size of models, size of neural networks, and number of objects searched at a time. Failure and associated data are saved when the graph of the perception task calculation does not produce results, which can trigger a training procedure for one or more models.

Figure 2:
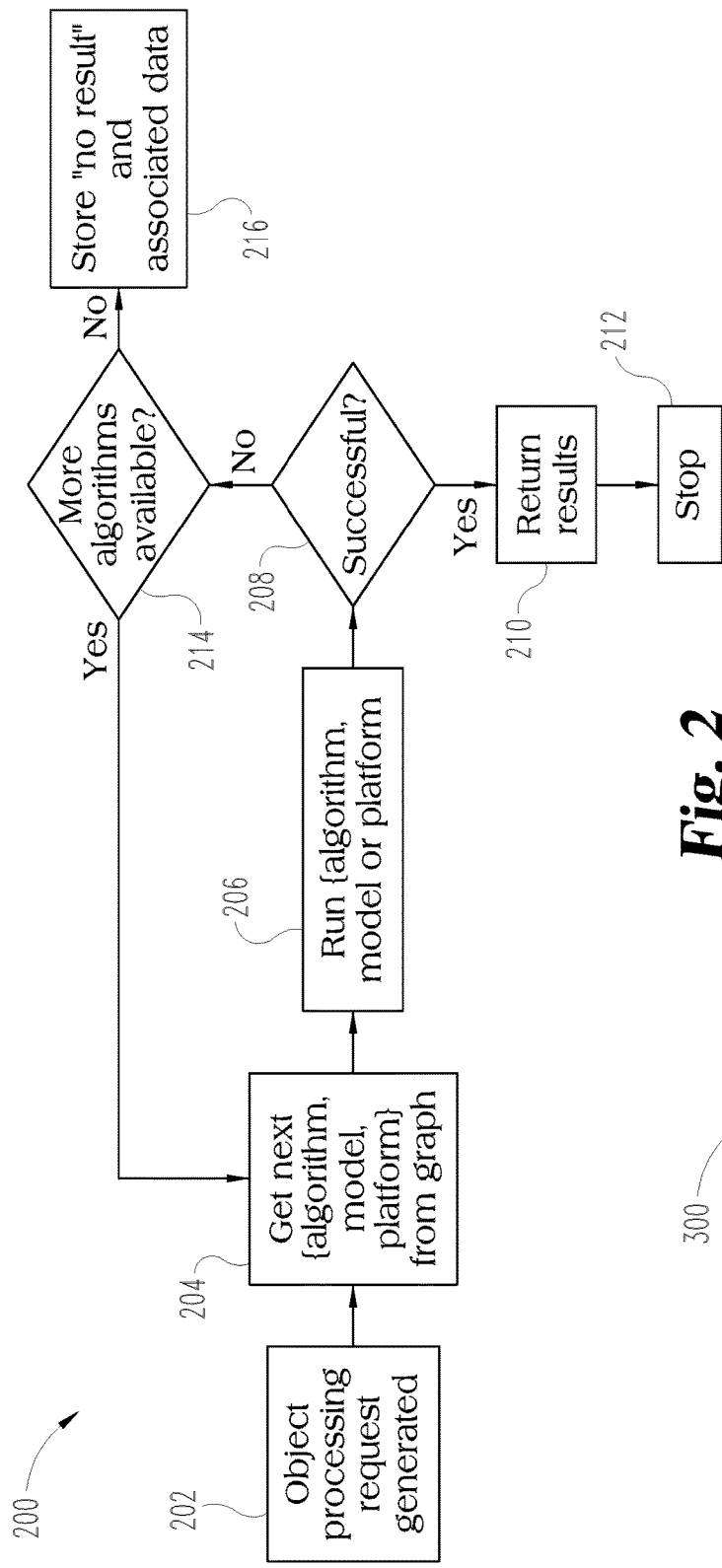
FIG. 2 is a schematic illustration of a flow diagram for selecting and running algorithms according to one exemplary embodiment of the present disclosure.
Figure 3:
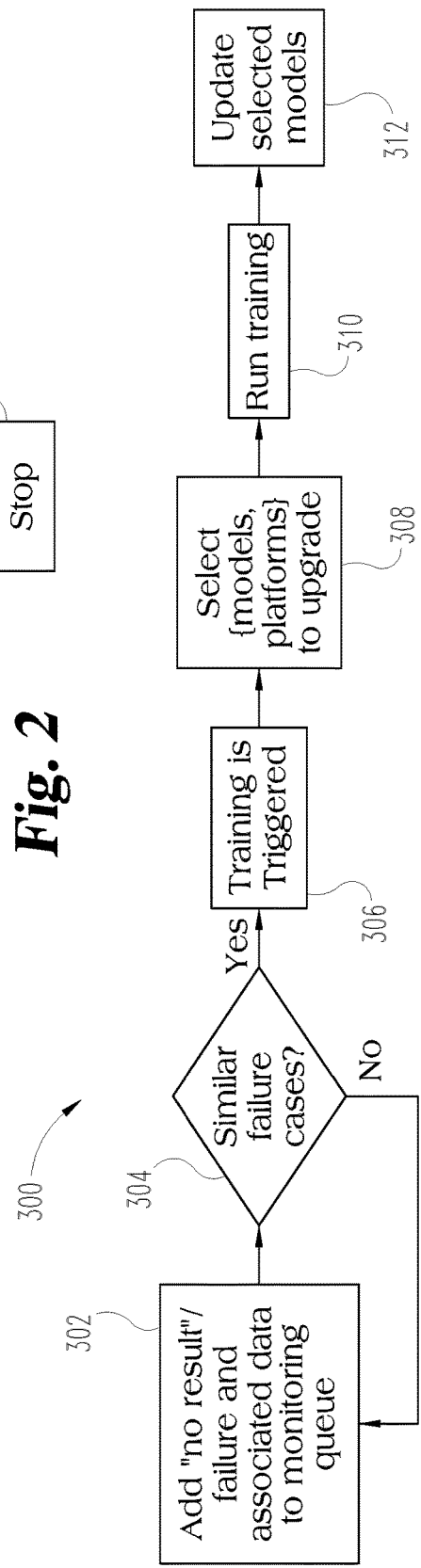
FIG. 3 is a schematic illustration of a flow diagram for monitoring a queue and triggering new training for upgrading a selected model according to another exemplary embodiment of the present disclosure.

An example workflow for selecting and running algorithms is shown in the flow diagram of FIG. 2, and an example workflow for monitoring a queue and triggering new training is shown in FIG. 3. The procedures of FIGS. 2 and 3 can be performed wholly or in part on edge computer 12, server computer 14, a combination of edge computer 12 and server computer 14, or with another computer.

FIG. 2 includes a procedure 200 with an operation 202 in which an object processing request is generated. Procedure 200 continues at operation 204 to select the next {algorithm, model, platform} in which to process the object request from a selection guide, such as a graph or chart. Procedure 200 continues at operation 206 to run the selected {algorithm, model} on the designated computing platform, i.e. the edge computer 12 or server computer 14.

Procedure 200 continues at conditional 208 to determine of the object processing request was successful. If conditional 208 is YES, procedure 200 continues at operation 210 to return the results of the object processing, and then stops at operation 212.

If conditional 208 is NO, procedure 200 continues at conditional 214 to determine if more algorithms are available. If conditional 214 is NO, the "no result" or failed object processing request and associated data is stored at operation 216, such as on edge computer 12 and/or server computer 14. If conditional 214 is YES, procedure 200 returns to operations 204 to get the next {algorithm, model, platform} in which to process the object request.

FIG. 3 includes a procedure 300 for monitoring a queue of "no results" or failed object processing requests and triggering a new model training procedure. Procedure 300 starts at operation 302 to add a "no result" or failure from operation 216 of FIG. 2 and associate the data from the "no result" to the monitoring queue. Procedure 300 continues at conditional 304 to determine if there are similar failure cases in the queue. If conditional 304 is NO, procedure 300 returns to operation 302.

If conditional 304 is YES, procedure 300 continues at operation 306 in which training is triggered. At operation 308, the {model, platform} on which to perform the upgrade is selected. At operation 310, the training is ran and at operation 312 the selected model(s) are updated based on the training.

According to one aspect of the present disclosure, an edge computer is provided for running a first set of paired algorithms and models for performing one or more perception tasks and evaluating results thereof. A server computer is in operative communication with the edge computer for running a second set of paired algorithms and models for performing one or more perception tasks and evaluating results thereof, The edge computer and the server computer are in operative communication with a robotic cell operable to perform the one or more perception tasks.

In one embodiment, the first set of paired algorithms and models are ranked in a first priority for performance and the second set of pair algorithms and models are ranked in a second priority for performance below the first priority.

In one embodiment, the edge computer is local to a robotic cell that includes a robot for performing the one or more perception tasks. In one embodiment, the server computer is remote from the robotic cell.

In one embodiment, the one or more perception tasks include categorization, classification, detection, location, sorting, segmentation, tracking, and image extraction of one or more objects.

In one embodiment, the edge computer and the server computer are each configured to: receive an object processing request; select a paired algorithm and model to perform the perception task for the object processing request; and run the perception task with the selected paired algorithm and model.

In one embodiment, the perception task is ran by one of the edge computer and the server computer with the selected paired algorithm and model according to a ranked priority between the edge computer and the server computer.

According to another aspect of the present disclosure, a method includes generating an object processing request; obtaining a paired algorithm and model for evaluation in response to the object processing request; running the obtained paired algorithm and model on a computing platform; evaluating a result for the object processing request from running of the obtained paired algorithm and model; and running a training algorithm to upgrade one or more models for performing the object processing request in response to the result indicating a failure of the object processing request.

In one embodiment, running the training algorithm is triggered in response to at least two failures of the object processing request using the paired algorithm and model.

In one embodiment, the method includes determining the object processing request using the paired algorithm and model has failed; obtaining a second paired algorithm and model for evaluation of the object processing request; running the second paired algorithm and model on the computing platform; and evaluating a second result for the object processing request from running of the second paired algorithm and model.

In one embodiment, the method includes determining the object processing request using the second paired algorithm and model has failed; obtaining a third paired algorithm and model for evaluation of the object processing request; running the third paired algorithm and model on a second computing platform; and evaluating a third result for the object processing request from running of the second paired algorithm and model on the second computing platform. In one embodiment, the computing platform is an edge computer and the second computing platform is a server computer.

In one embodiment, the method includes determining the object processing request using the paired algorithm and model has failed; obtaining a second paired algorithm and model for evaluation of the object processing request; running the second paired algorithm and model on a second computing platform; and evaluating a second result for the object processing request from running of the second paired algorithm and model on the second computing platform. In one embodiment, the computing platform is an edge computer and the second computing platform is a server computer.

According to another aspect, a method includes generating an object processing request; obtaining a first paired algorithm and model for evaluation in response to the object processing request; running the paired algorithm and model on a first computing platform; evaluating a result for the object processing request from running of the first paired algorithm and model; and in response to the result indicating a failed object processing request, obtaining a second paired algorithm and model for evaluation of the object processing request, running the second paired algorithm and model, and evaluating the result for the object processing request from running the second paired algorithm and model.

In one embodiment, the method includes running a training algorithm to upgrade one or more models for performing the object processing request in response to the result indicating at least two failed object processing requests. In one embodiment, the first computing platform is an edge computer.

In one embodiment, the method includes storing the failed object processing request and associated data. In one embodiment, the method includes determining the second paired algorithm and model for evaluation of the object processing request is available before obtaining the second paired algorithm and model.

In one embodiment, the second paired algorithm and model are ran on a second computing platform, and the first computing platform is an edge computer and the second computing platform is a server computer.

While the application has been illustrated and described in detail in the drawings and foregoing description, the same is to be considered as illustrative and not restrictive in character, it being understood that only the preferred embodiments have been shown and described and that all changes and modifications that come within the spirit of the applications are desired to be protected. In reading the claims, it is intended that when words such as "a," "an," "at least one," or "at least one portion" are used there is no intention to limit the claim to only one item unless specifically stated to the contrary in the claim. When the language "at least a portion" and/or "a portion" is used the item can include a portion and/or the entire item unless specifically stated to the contrary.

Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

What is claimed is:

1. A system comprising:
   an edge computer for running a first set of paired algorithms and models for performing one or more perception tasks and evaluating results thereof; and
   a server computer in operative communication with the edge computer for running a second set of paired algorithms and models for performing the one or more perception tasks and evaluating results thereof, wherein the edge computer and the server computer are in operative communication with a robotic cell operable to perform the one or more perception tasks.

2. The system of claim 1, wherein the first set of paired algorithms and models are ranked in a first priority for performance and the second set of pair algorithms and models are ranked in a second priority for performance below the first priority.

3. The system of claim 1, wherein the edge computer is local to a robotic cell that includes a robot for performing the one or more perception tasks.

4. The system of claim 2, wherein the server computer is remote from the robotic cell.

5. The system of claim 1, wherein the one or more perception tasks include categorization, classification, detection, location, sorting, segmentation, tracking, and image extraction of one or more objects.

6. The system of claim 1, wherein the edge computer and the server computer are each configured to:
   receive an object processing request;
   select a paired algorithm and model to perform the perception task for the object processing request; and
   run the perception task with the selected paired algorithm and model.

7. The system of claim 6, wherein the perception task is ran by one of the edge computer and the server computer with the selected paired algorithm and model according to a ranked priority between the edge computer and the server computer.

8. A method, comprising:
generating an object processing request;
obtaining a paired algorithm and model for evaluation in response to the object processing request;
running the obtained paired algorithm and model on a computing platform;
evaluating a result for the object processing request from running of the obtained paired algorithm and model;
running a training algorithm to upgrade one or more models for performing the object processing request in response to the result indicating a failure of the object processing request;
determining the object processing request using the paired algorithm and model has failed;
obtaining a second paired algorithm and model for evaluation of the object processing request;
running the second paired algorithm and model on either the computing platform or a second computing platform; and
evaluating a second result for the object processing request from running of the second paired algorithm and model.

9. The method of claim 8, wherein running the training algorithm is triggered in response to at least two failures of the object processing request using the paired algorithm and model.

10. The method of claim 8, further comprising:
determining the object processing request using the second paired algorithm and model has failed;
obtaining a third paired algorithm and model for evaluation of the object processing request; running the third paired algorithm and model on a second computing platform; and
evaluating a third result for the object processing request from running of the second paired algorithm and model on the second computing platform.

11. The method of claim 10, wherein the computing platform in an edge computer and the second computing platform is a server computer.

12. The method of claim 8, wherein the computing platform is an edge computer and the second computing platform is a server computer.

13. A method, comprising:
generating an object processing request;
obtaining a first paired algorithm and model for evaluation in response to the object processing request;
running the paired algorithm and model on a first computing platform;
evaluating a result for the object processing request from running of the first paired algorithm and model; and
in response to the result indicating a failed object processing request, obtaining a second paired algorithm and model for evaluation of the object processing request, running the second paired algorithm and model, and evaluating the result for the object processing request from running the second paired algorithm and model.

14. The method of claim 13, further comprising running a training algorithm to upgrade one or more models for performing the object processing request in response to the result indicating at least two failed object processing requests.

15. The method of claim 13, wherein the first computing platform is an edge computer.

16. The method of claim 13, further comprising storing the failed object processing request and associated data.

17. The method of claim 13, further comprising determining the second paired algorithm and model for evaluation of the object processing request is available before obtaining the second paired algorithm and model.

18. The method of claim 13, wherein the second paired algorithm and model are ran on a second computing platform, wherein the first computing platform is an edge computer and the second computing platform is a server computer.

* * * * *